(12) United States Patent
Koike

(10) Patent No.: US 7,545,695 B2
(45) Date of Patent: Jun. 9, 2009

(54) ASYNCHRONOUS SENSE AMPLIFIER FOR READ ONLY MEMORY

(75) Inventor: Hideharu Koike, Yokohama (JP)

(73) Assignee: Winbond Electronics Corp., Hsinchu (TW)

( * ) Notice: Subject to any disclaimer, the term of this patent is extended or adjusted under 35 U.S.C. 154(b) by 77 days.

(21) Appl. No.: 11/876,299

(22) Filed: Oct. 22, 2007

(65) Prior Publication Data

US 2009/0103381 A1    Apr. 23, 2009

(51) Int. Cl.
    *G11C 7/02*    (2006.01)
(52) U.S. Cl. .............. 365/207; 365/205; 365/210.11
(58) Field of Classification Search .......... 365/205, 365/207, 210.11
    See application file for complete search history.

(56) References Cited

U.S. PATENT DOCUMENTS

| | | | |
|---|---|---|---|
| 6,181,621 B1 * | 1/2001 | Lovett | 365/205 |
| 6,353,568 B1 * | 3/2002 | Sung | 365/207 |
| 6,519,197 B2 | 2/2003 | Forbes | |
| 6,535,025 B2 * | 3/2003 | Terzioglu et al. | 327/51 |
| 6,633,188 B1 * | 10/2003 | Jia et al. | 327/217 |
| 6,683,818 B1 * | 1/2004 | Cornell et al. | 365/198.15 |
| 6,937,538 B2 * | 8/2005 | Terzioglu et al. | 365/230.06 |
| 7,126,869 B1 | 10/2006 | Chou | |
| 7,161,862 B1 * | 1/2007 | Lin et al. | 365/207 |
| 2006/0171245 A1 * | 8/2006 | Soares et al. | 365/233 |

* cited by examiner

*Primary Examiner*—Tuan T Nguyen
*Assistant Examiner*—Hien N Nguyen
(74) *Attorney, Agent, or Firm*—Connolly Bove Lodge & Hutz LLP; Myron Keith Wyche

(57) ABSTRACT

The asynchronous sense amplifier for a ROM includes a current-mirror circuit, a first negative feedback inverter, a second negative feedback inverter, a first transistor group, a second transistor group and a feedback transistor. The feedback transistor connects the junction of the first transistor group and the first set of the current-mirror circuit and/or the junction of the second transistor group and the second set of the current-mirror circuit to ground, where the feedback transistor is controlled by the output of the first negative feedback inverter and/or the second negative feedback inverter, and the feedback transistor is smaller than one transistor of the second transistor group.

18 Claims, 5 Drawing Sheets

ASYNCHRONOUS SENSE AMPLIFIER FOR READ ONLY MEMORY

BACKGROUND OF THE INVENTION

1. Field of the Invention

The present invention relates to a sense amplifier for a read only memory (ROM), and more particularly to an asynchronous sense amplifier.

2. Description of the Related Art

For highly integrated systems, a high speed ROM is required for any system with a high speed CPU. It is common practice that an instruction code is able to be read from a program ROM and executed within the same cycle. In other words, the access time of a program ROM should be less than half of one instruction cycle. For example, if a CPU is running at 100 MHz, the access time should be less than 5 ns.

FIG. 1 depicts a sense amplifier disclosed in U.S. Pat. No. 6,519,197. The sense amplifier 10 uses two pre-charge clocks phi1 and phi2, which reflects that the sense amplifier 10 is a synchronous circuit. Generally, synchronous sense amplifiers or synchronous ROM are more complicated and slower than asynchronous ones. For example, a synchronous sense amplifier needs a pre-charge period, but an asynchronous sense amplifier does not. Also, a synchronous sense amplifier needs a timing circuit to generate a pre-charge pulse, which occupies more chip area, but an asynchronous sense amplifier does not.

FIG. 2 depicts a sense amplifier disclosed in U.S. Pat. No. 7,126,869. The sense amplifier 20 includes a positive feedback with an inverter 21 and P channel transistors 22, 23. Also, a clock signal BPCHG acts as a pre-charge signal of a bit line. Apparently, this sense amplifier 20 is still a synchronous circuit, which possesses the same drawbacks as the structure in FIG. 1.

SUMMARY OF THE INVENTION

The objective of the present invention is to provide an asynchronous sense amplifier for a ROM, which occupies a smaller area and has a faster switching speed.

The asynchronous sense amplifier for a ROM in accordance with the embodiment of the present invention comprises a current-mirror circuit, a first negative feedback inverter, a second negative feedback inverter, a first transistor group, a second transistor group and a feedback transistor. The current-mirror circuit includes three common terminal pairs and two transistor pairs, where the first common terminal pair is consisted with a common voltage terminal and a voltage output terminal, the second common terminal pair is consisted with a first current sink terminal and a second current sink terminal, the third common terminal pair is consisted with a first power supply terminal and a second power supply terminal, the first transistor pair connects the first common terminal pair to the second common terminal pair, and the second transistor pair connects the first common terminal pair to the third common terminal pair, the current flowing from the first power supply terminal through the first current sink terminal is the same to the current flowing from the second power supply terminal through the second current sink terminal. The first negative feedback inverter is connected to the voltage output terminal of the current-mirror circuit. The second negative feedback inverter is connected to the output of the first negative feedback inverter. The first transistor group is connected to the first current sink terminal of the current-mirror circuit. The second transistor group is connected to the second current sink terminal of the current-mirror circuit. The feedback transistor supplies pull-down current to the first current sink terminal and/or the second current sink terminal of the current-mirror circuit, where the feedback transistor is controlled by the output of the first negative feedback inverter and/or the second negative feedback inverter, and the feedback transistor is smaller than any transistor of the second transistor group.

BRIEF DESCRIPTION OF THE DRAWINGS

The invention will be described according to the appended drawings in which.

PREFERRED EMBODIMENT OF THE PRESENT INVENTION

Figure 1:
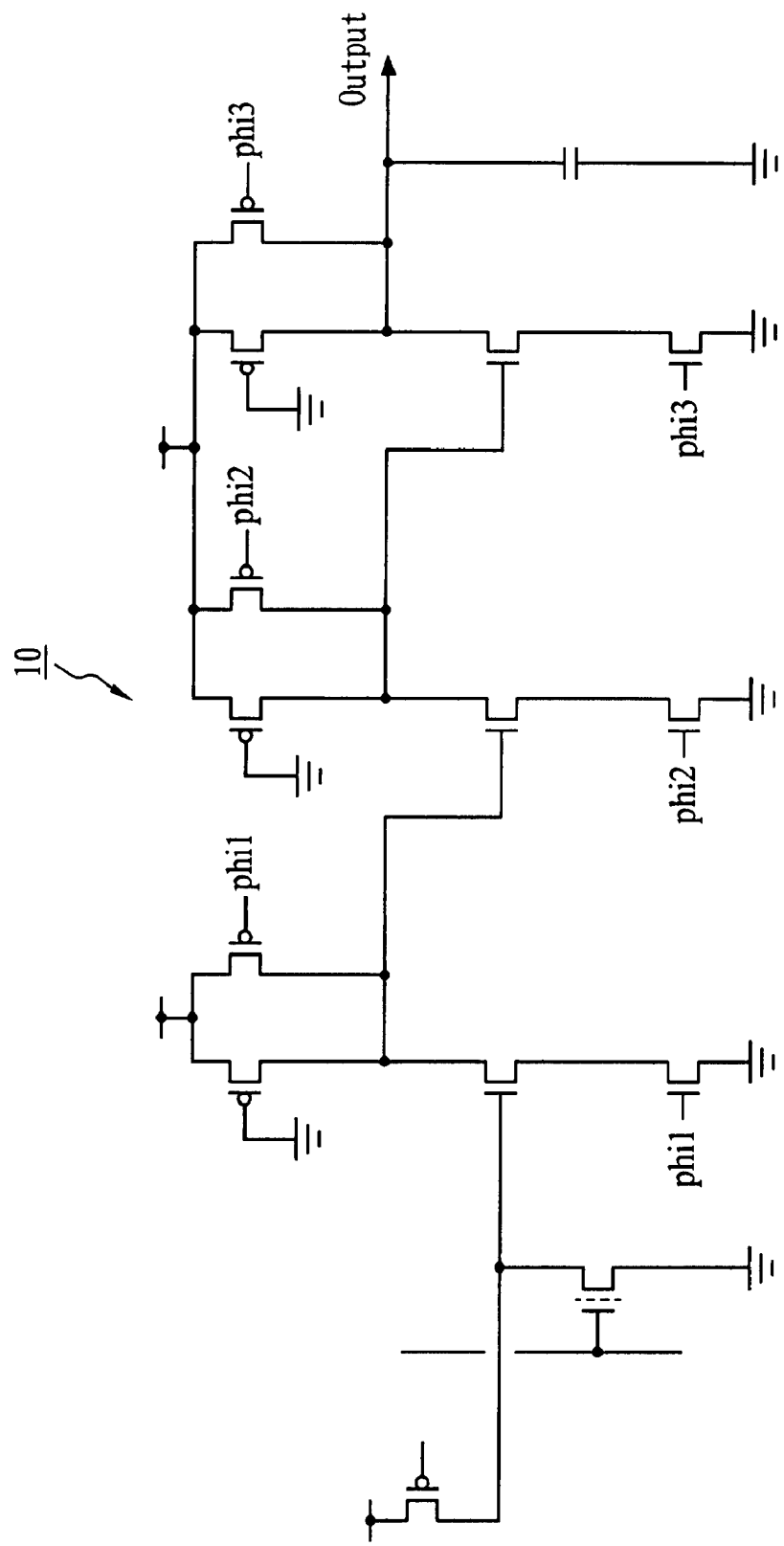
FIG. 1 shows a prior art circuit.
Figure 2:
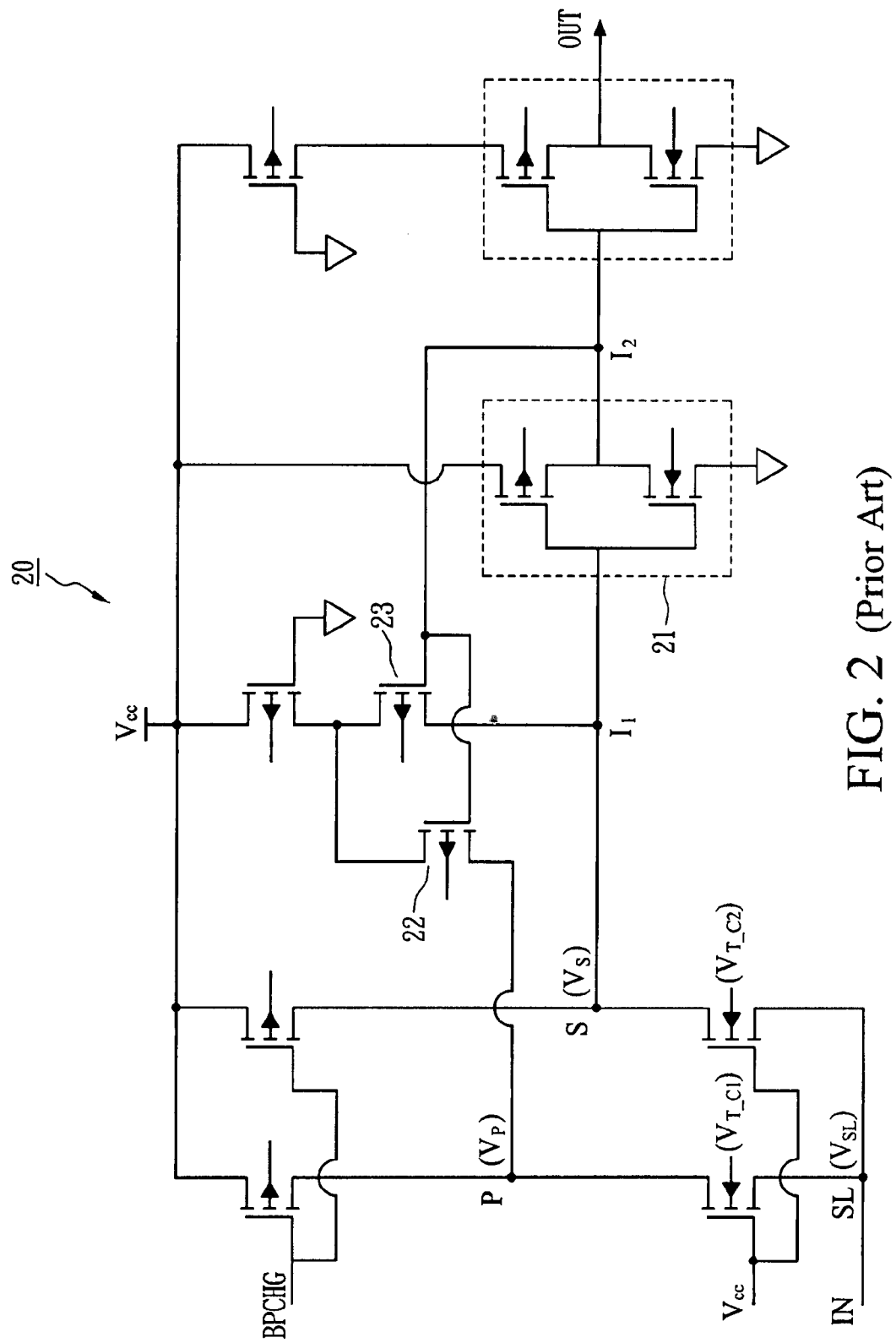
FIG. 2 shows another prior art circuit.
Figure 3:
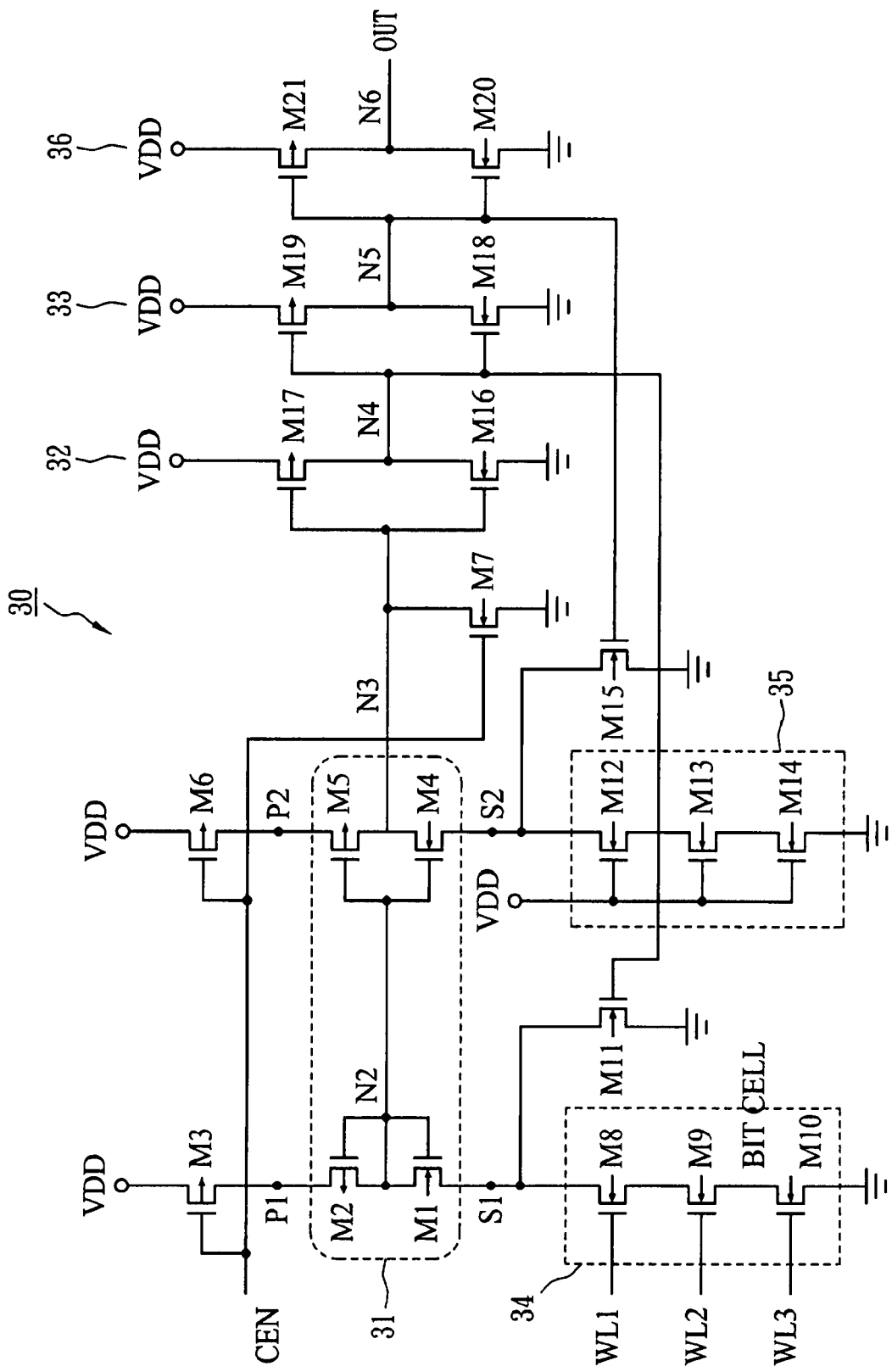
FIG. 3 shows an asynchronous sense amplifier for a ROM in accordance with a first embodiment of the present invention.

FIG. 3 shows an asynchronous sense amplifier for a ROM in accordance with a first embodiment of the present invention. The asynchronous sense amplifier 30 includes a current-mirror circuit 31, a first negative feedback inverter 32, a second negative feedback inverter 33, a first transistor group 34, a second transistor group 35 and feedback transistors M11 and M15. Optionally, there is an output-stage inverter 36 connected to the second negative feedback inverter 33. The current-mirror circuit 31 includes three common terminal pairs and two transistor pairs, where the first common terminal pair is consisted with a common voltage terminal N2 and a voltage output terminal N3, the second common terminal pair is consisted with a first current sink terminal S1 and a second current sink terminal S2, the third common terminal pair is consisted with a first power supply terminal P1 and a second power supply terminal P2, the first transistor pair including transistors M1, M4 connects the first common terminal pair to the second common terminal pair, and the second transistor pair including transistors M2, M5 connects the first common terminal pair to the third common terminal pair. The transistors M1 and M4 have the same size, and the transistors M2 and M5 have the same size. The transistors M1 and M2 constitute a first current path from the first power supply terminal to the first current sink terminal, the transistors M4 and M5 constitute a second current path from the second power supply terminal to the second current sink terminal, and the current flowing through the first current path is the same as that of the second current path. The first transistor group 34, which connects to the first current sink terminal S1, includes transistors M8, M9 and M10. The transistors M8 and M9, which are selectively turned on by the word line selection signals WL1 and WL2, are included in an address decoder. The transistor M10 corresponds to a data bit. If the corresponding data is logic 0, then the transistor M10 is connected to the bit line. The second transistor group 35, which connects to the second current sink terminal S2, includes transistors M12, M13 and M14. Because the gates of the transistors M12, M13 and M14 are connected to VDD, the second transistor group 35 is always turned on. The transistor M8 is the same size as the transistor M12, and the transistor M9 is the same size as the transistor M13, but the transistor M14 is a half size of the transistor M10. The first negative feedback inverter 32 connects to the voltage output terminal N3 of the current-mirror circuit 31, and the second negative feedback inverter 33 connects to the output node N4 of the first negative feedback inverter 32. The feedback transistor M11 supplies pull-down current to the first sink current terminal S1 and is controlled by the node N4. Similarly, the feedback transistor M15 supplies pull-down current to the second sink current terminal S2 and is controlled by the node N5. The feedback transistors M11 and M15 are the same size, but are smaller than the transistor M14.

The signal CEN acts as a power-down signal of the ROM. When CEN is at logic 1, the current paths of the sense amplifier 30 are closed, and the voltage of the nodes N2 and N3 is pulled down to logic 0. Meanwhile, the output-stage inverter 36 becomes logic 1. Three transistors M3, M6 and M7, all of which are controlled by the power-down control signal CEN, are added to the application in a power-down mode. The transistor M3 connects power VDD to the first power supply terminal P1 of the current-mirror circuit 31, the transistor M6 connects power VDD to the second power supply terminal P2 of the current-mirror circuit 31 and the transistor M7 seeks to ground the voltage output terminal N3. When a power-down control signal CEN is initiated, the transistors M3 and M6 are turned off and the transistor M7 is turned on, so the node N3 is pulled down to grounding level. Therefore, the node N6 of the output-stage inverter 36 will remain at logic 1 while in the power-down mode.

When the signal CEN is equal to 0, WL1 is equal to 1, WL2 is equal to 1, and WL3 is equal to 0; the transistor M10 is turned off, and thus the current flowing through the transistor M1 is smaller than the current flowing through the transistor M4. Meanwhile, the voltage of the node N3 is lower than that of the node N2, and the lower voltage of the node N3 causes the voltage of the node N4 to be higher. Thereafter, the higher voltage of the node N4 turns on the transistor M11. However, because the transistor M11 is smaller than the transistor M14, the current flowing through the transistor M1 is still smaller than that flowing through the transistor M4. By means of this feedback mechanism, the voltage of the node N2 is lowered by the feedback transistor M11, and the voltage of the node N3 becomes higher. If the voltage of the node N3 is still lower than the threshold voltage of the first negative feedback inverter 32, the node N4 remains at logic 1, the node N5 remains at logic 0, and the node N6 of the output stage inverter 35 remains at logic 1.

When the signal CEN is equal to 0, WL1 is equal to 1, WL2 is equal to 1, and WL3 changes its state from logic 0 to logic 1, the transistors M8, M9 and M10 are turned on, and thus the current flowing through the transistor M1 is bigger than the current flowing through the transistor M4. Meanwhile, the voltage of the node N3 is higher than that of the node N2. If the voltage of the node N3 is higher than the threshold voltage of the first negative feedback inverter 32, the node N4 will change to logic 0, and the node N5 will change to logic 1, which turns on the transistor M15. However, because the size of the transistor M15 is less than half the size of the transistor M10, the current flowing through the transistor M4 is still smaller than that flowing through the transistor M1. By means of this feedback mechanism, the voltage of the node N2 becomes higher, and the voltage of the node N3 is lowered by the feedback transistor M15. If the voltage of the node N3 is still higher than the threshold voltage of the first negative feedback inverter 32, the node N4 remains at logic 0, the node N5 remains at logic 1, and the node N6 of the output stage inverter 35 remains at logic 0. Because the voltage of the bit line is lower than that of the node N2 minus the threshold voltage of the transistor M1, the time to charge and discharge the bit line is thus shortened, and the power consumption is reduced as well.

Figure 4:
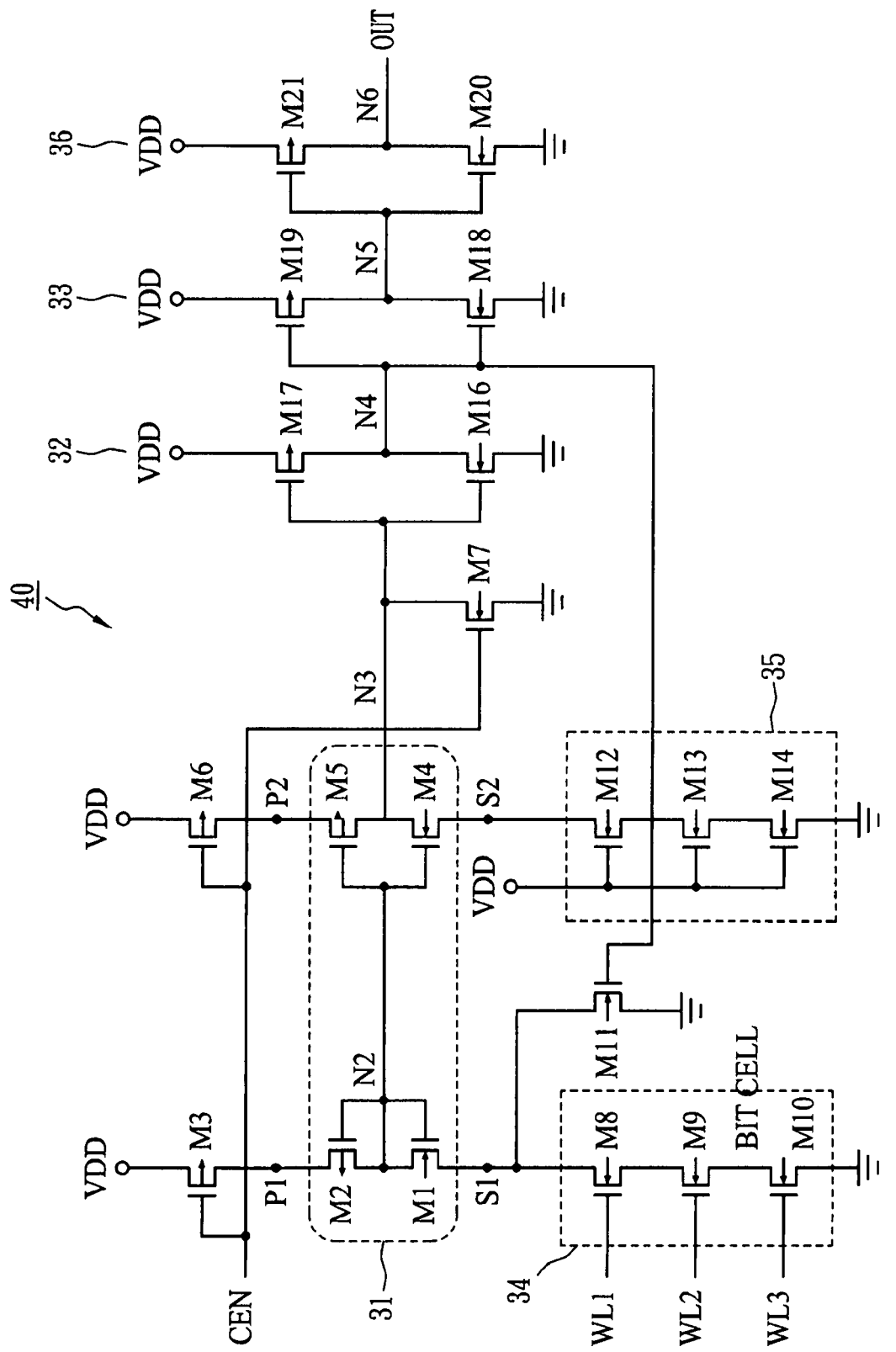
FIG. 4 shows an asynchronous sense amplifier for a ROM in accordance with a second embodiment of the present invention.

FIG. 4 shows an asynchronous sense amplifier for a ROM in accordance with a second embodiment of the present invention. Compared with the structure in FIG. 3, the transistor M15 is omitted. The node N3 of the second embodiment has a higher voltage, and thus increases the discharge time of the node N3. However, this structure can save the cost of a feedback transistor M15 and its routing wire.

Figure 5:
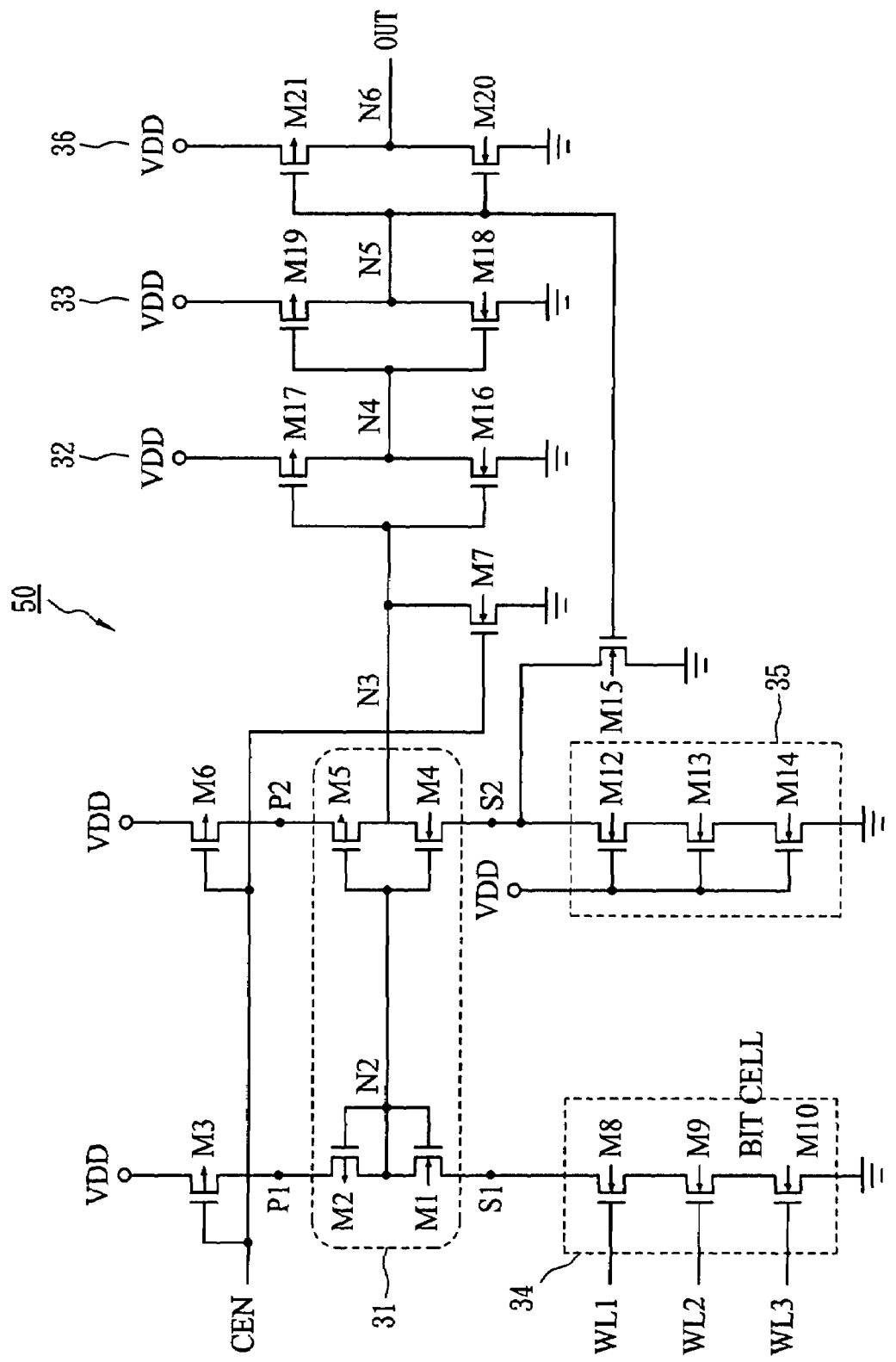
FIG. 5 shows an asynchronous sense amplifier for a ROM in accordance with a third embodiment of the present invention.

FIG. 5 shows an asynchronous sense amplifier for a ROM in accordance with a third embodiment of the present invention. Compared with the structure in FIG. 3, the transistor M11 is omitted. The node N2 of the third embodiment has a higher voltage, and thus increases the discharge time of the node N2. However, because the voltage of the node N2 does not change as much as that of the node N3, the speed of the structure of the third embodiment is close to that of the first embodiment.

The asynchronous sense amplifiers of the present embodiments minimize the voltage change of bit lines, and thus the time to charge and discharge the bit line is reduced. For example, by means of the feedback transistors M11 and M15, the voltage of the nodes N2 and N3 is pulled down in due course so as to prevent them from rising too high, and thus reduces the transition time. Also, the present asynchronous sense amplifiers have a single input and a single output, which can be easily connected to a bit line and data line of a ROM. Furthermore, the present asynchronous sense amplifiers do not use any constant current source or constant voltage source. To reduce unnecessary power consumption, the present asynchronous sense amplifiers utilize a power-down control mode. And even in a normal situation, the power consumption of the asynchronous sense amplifiers is very small. The present asynchronous sense amplifiers are also robust and stable to any variation of operation conditions, such as manufacturing process, temperature and power supply voltage.

The above-described embodiments of the present invention are intended to be illustrative only. Numerous alternative embodiments may be devised by persons skilled in the art without departing from the scope of the following claims.

What is claimed is:

1. An asynchronous sense amplifier for a read only memory (ROM), comprising:
    a current-mirror circuit including three common terminal pairs and two transistor pairs, wherein the first common terminal pair includes a common voltage terminal and a voltage output terminal, the second common terminal pair includes a first current sink terminal and a second current sink terminal, the third common terminal pair includes a first power supply terminal and a second power supply terminal, the first transistor pair connects the first common terminal pair to the second common terminal pair, and the second transistor pair connects the first common terminal pair to the third common terminal pair; the current flowing from the first power supply terminal through the first current sink terminal is the same to the current flowing from the second power supply terminal through the second current sink terminal;
    a first negative feedback inverter connected to the voltage output terminal of the current-mirror circuit;
    a second negative feedback inverter connected to the output of the first negative feedback inverter;
    a first transistor group connected to the first current sink terminal of the current-mirror circuit;

a second transistor group connected to the second current sink terminal of the current-mirror circuit; and a feedback transistor supplying a pull-down current to the first current sink terminal, wherein the feedback transistor is controlled by the output of the first negative feedback inverter, and the feedback transistor is smaller than any transistor of the second transistor group.

2. The asynchronous sense amplifier according to claim 1, wherein the first transistor group includes a bit-cell transistor, and the size of the feedback transistor is less than the half size of the bit-cell transistor.

3. The asynchronous sense amplifier according to claim 1, wherein the second transistor group includes transistors which are always turned on.

4. The asynchronous sense amplifier according to claim 1, wherein transistors in the first transistor group are controlled by word lines.

5. The asynchronous sense amplifier according to claim 1, further comprising an output-stage inverter connected to the second negative feedback inverter.

6. The asynchronous sense amplifier according to claim 1, further comprising a transistor connecting a power supply to the current-mirror circuit, wherein the transistor is turned off if a power-down mode is initiated.

7. The asynchronous sense amplifier according to claim 1, further comprising a transistor connecting the voltage output terminal of the current-mirror circuit to ground, wherein the transistor is turned on if a power-down mode is initiated.

8. An asynchronous sense amplifier for a ROM, comprising:

a current-mirror circuit including three common terminal pairs and two transistor pairs, wherein the first common terminal pair includes a common voltage terminal and a voltage output terminal, the second common terminal pair includes a first current sink terminal and a second current sink terminal, the third common terminal pair includes a first power supply terminal and a second power supply terminal, the first transistor pair connects the first common terminal pair to the second common terminal pair, and the second transistor pair connects the first common terminal pair to the third common terminal pair; the current flowing from the first power supply terminal through the first current sink terminal is the same to the current flowing from the second power supply terminal through the second current sink terminal;

a first negative feedback inverter connected to the voltage output terminal of the current-mirror circuit;

a second negative feedback inverter connected to the output of the first negative feedback inverter;

a first transistor group connected to the first current sink terminal of the current-mirror circuit;

a second transistor group connected to the second current sink terminal of the current-mirror circuit; and a feedback transistor supplying a pull-down current to the second current sink terminal, wherein the feedback transistor is controlled by the output of the second negative feedback inverter, and the feedback transistor is smaller than any transistor of the second transistor group.

9. The asynchronous sense amplifier according to claim 8, wherein the first transistor group includes a bit-cell transistor, and the size of the feedback transistor is less than half the size of the bit-cell transistor.

10. The asynchronous sense amplifier according to claim 8, wherein the second transistor group includes transistors which are always turned on.

11. The asynchronous sense amplifier according to claim 8, wherein transistors in the first transistor group are controlled by word lines.

12. The asynchronous sense amplifier according to claim 8, further comprising an output-stage inverter connected to the second negative feedback inverter.

13. The asynchronous sense amplifier according to claim 8, further comprising a transistor connecting a power supply to the current-mirror circuit, wherein the transistor is turned off if a power-down mode is initiated.

14. The asynchronous sense amplifier according to claim 8, further comprising a transistor connecting the voltage output terminal of the current-mirror circuit to ground, wherein the transistor is turned on if a power-down mode is initiated.

15. An asynchronous sense amplifier for a ROM, comprising:

a current-mirror circuit including three common terminal pairs and two transistor pairs, wherein the first common terminal pair includes a common voltage terminal and a voltage output terminal, the second common terminal pair includes a first current sink terminal and a second current sink terminal, the third common terminal pair includes a first power supply terminal and a second power supply terminal, the first transistor pair connects the first common terminal pair to the second common terminal pair, and the second transistor pair connects the first common terminal pair to the third common terminal pair; the current flowing from the first power supply terminal through the first current sink terminal is the same to the current flowing from the second power supply terminal through the second current sink terminal;

a first negative feedback inverter connected to the voltage output terminal of the current-mirror circuit;

a second negative feedback inverter connected to the output of the first negative feedback inverter;

a first transistor group connected to the first current sink terminal of the current-mirror circuit;

a second transistor group connected to the second current sink terminal of the current-mirror circuit;

a first feedback transistor supplying a pull-down current to the first current sink terminal, wherein the first feedback transistor is controlled by the output of the first negative feedback inverter, and the first feedback transistor is smaller than any transistor of the second transistor group; and a second feedback transistor supplying a pull-down current to the second current sink terminal, wherein the second feedback transistor is controlled by the output of the second negative feedback inverter, and the second feedback transistor is smaller than any transistor of the second transistor group.

16. The asynchronous sense amplifier according to claim 15, further comprising an output-stage inverter connected to the second negative feedback inverter.

17. The asynchronous sense amplifier according to claim 15, further comprising a transistor connecting a power supply to the current-mirror circuit, wherein the transistor is turned off if a power-down mode is initiated.

18. The asynchronous sense amplifier according to claim 15, further comprising a transistor connecting the voltage output terminal of the current-mirror circuit to ground, wherein the transistor is turned on if a power-down mode is initiated.

* * * * *